United States Patent
Mashiko et al.

(10) Patent No.: US 11,476,395 B2
(45) Date of Patent: Oct. 18, 2022

(54) LIGHT SOURCE, LED DEVICE, AND LIGHT EMITTING DISPLAY STRUCTURE

(71) Applicants: ASAHI RUBBER INC., Saitama (JP); NATIONAL UNIVERSITY CORPORATION SAITAMA UNIVERSITY, Saitama (JP)

(72) Inventors: Naoya Mashiko, Saitama (JP); Takashi Kanahira, Saitama (JP); Masutsugu Tasaki, Saitama (JP); Eiji Ishiguro, Saitama (JP); Keiichi Watanuki, Saitama (JP); Keiichi Muramatsu, Saitama (JP); Kazunori Kaede, Saitama (JP)

(73) Assignees: ASAHI RUBBER INC., Saitama (JP); NATIONAL UNIVERSITY CORPORATION SAITAMA UNIVERSITY, Saitama (JP)

( * ) Notice: Subject to any disclaimer, the term of this patent is extended or adjusted under 35 U.S.C. 154(b) by 0 days.

(21) Appl. No.: 17/422,430

(22) PCT Filed: Jul. 11, 2019

(86) PCT No.: PCT/JP2019/027485
§ 371 (c)(1),
(2) Date: Jul. 12, 2021

(87) PCT Pub. No.: WO2020/144882
PCT Pub. Date: Jul. 16, 2020

(65) Prior Publication Data
US 2021/0367115 A1 Nov. 25, 2021

(30) Foreign Application Priority Data

Jan. 11, 2019 (JP) .............................. JP2019-003588

(51) Int. Cl.
*H01L 33/50* (2010.01)
*H01L 33/52* (2010.01)
(Continued)

(52) U.S. Cl.
CPC ........ *H01L 33/505* (2013.01); *C09K 11/7706* (2013.01); *G02F 1/133603* (2013.01);
(Continued)

(58) Field of Classification Search
CPC ............. H01L 33/504; F21V 3/08; F21K 9/64
See application file for complete search history.

(56) References Cited

U.S. PATENT DOCUMENTS

2008/0272701 A1* 11/2008 Park ..................... G09G 3/3413
 315/151
2013/0214704 A1 8/2013 Gerlach et al.
(Continued)

FOREIGN PATENT DOCUMENTS

EP 0 890 996 A2 1/1999
JP H11-087784 A 3/1999
(Continued)

OTHER PUBLICATIONS

Saito, Daiki et al., "Evaluation of Legibility and Visual Fatigue caused by Luminescent Text Displays", Proceedings of the 1st International Conference on Intelligent Human Systems Integration (IHSI 2018): Integrating People and Intelligent Systems, Jan. 7-9, 2018, Dubai, United Arab Emirates, pp. 1-5.
(Continued)

*Primary Examiner* — Andrew J Coughlin
(74) *Attorney, Agent, or Firm* — Oliff PLC

(57) ABSTRACT

A light source that emits light, wherein, in coordinates in a CIE 1931 chromaticity diagram, the light has a color purity included in a region of 2 to 50 in a region surrounded by a line segment WB and a line segment WG that connect
(Continued)

coordinates W (0.33, 0.33) indicating an achromatic color with coordinates B (0.091, 0.133) of 480 nm and coordinates G (0.373, 0.624) of 560 nm on a spectral locus, and the spectral locus, and has an area occupied by a continuous spectral wavelength in a wavelength region of 480 to 540 nm, of 15% or more relative to an area of an overall spectral wavelength of the light source at 380 to 780 nm.

12 Claims, 10 Drawing Sheets

(51) Int. Cl.
  *C09K 11/77* (2006.01)
  *H01L 33/62* (2010.01)
  *G02F 1/13357* (2006.01)
  *H01L 33/60* (2010.01)
(52) U.S. Cl.
  CPC ............ *H01L 33/502* (2013.01); *H01L 33/52* (2013.01); *H01L 33/60* (2013.01); *H01L 33/62* (2013.01)

(56) References Cited

U.S. PATENT DOCUMENTS

| 2013/0329420 A1 | 12/2013 | Matsubayashi |
| 2014/0293608 A1 | 10/2014 | Kanahira |

FOREIGN PATENT DOCUMENTS

| JP | 2003-214912 A | 7/2003 |
| JP | 2003-257224 A | 9/2003 |
| JP | 2009-260393 A | 11/2009 |
| JP | 2012-150304 A | 8/2012 |
| JP | 2012-155143 A | 8/2012 |
| JP | 2013-171689 A | 9/2013 |
| JP | 2013-258037 A | 12/2013 |
| JP | 2014-209617 A | 11/2014 |
| JP | 2016-133315 A | 7/2016 |

OTHER PUBLICATIONS

Mashiko, Naoya et al., "Legibility and visual fatigue from white luminescent text displays with different spectral wavelengths", Proceedings of the 8th Lux Pacifica Tokyo, Japan, Mar. 7, 2018, pp. 1-4.

Tajima, Kenji et al., "Preliminary Study on Estimating Legibility and Visual Fatigue Against LED Lightings by Deep Learning of Biological Information", Proceedings of 13th AIC Congress, Oct. 16-20, 2017, pp. 1-4.

Tajima, Kenji et al., "Preliminary study of estimating fatigue based on biological information for surface emissive character display", Kanto Student Association 57th Student Graduation Research Presentation Lecture Proceedings, Mar. 16, 2018, Tokyo, Japan, pp. 1-5.

Saito, Daiki e al., "Trial for Fatigue Evaluation on Single Wavelength LED using Physiological Measurement", The 17th SICE System Integration Division Annual Conference, Dec. 15-17, 2016, Sapporo, Japan, pp. 1-4.

Nishikawa, Tomohiro et al., "Development of Estimating System of Visual Fatigue against Luminescent Text Display based on Physiological Index", The Japan Society of Mechanical Engineers, Mechanical Engineering Congress 2018, Sep. 9-12, 2018, Suita, Japan, pp. 1-5.

Sep. 24, 2019 Search Report issued in International Patent Application No. PCT/JP2019/027485.

* cited by examiner

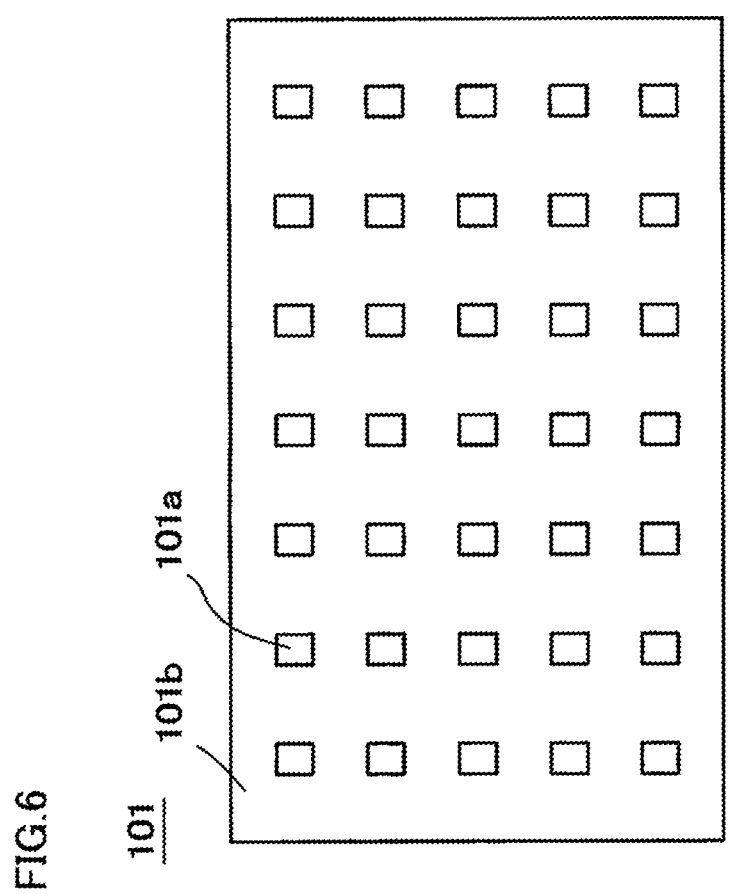

FIG. 7

[Table 2]

Items of subjective symptoms of eye strain

| | 1. Not felt at all | 2. Slightly felt | 3. Somewhat felt | 4. Felt | 5. Somewhat strongly felt | 6. Very strongly felt | 7. Extremely strongly felt |
|---|---|---|---|---|---|---|---|
| (1) Feel strained in the eyes | | | | | | | |
| (2) Have sore eyes | | | | | | | |
| (3) Feel heavy in the eyes | | | | | | | |
| (4) Have a blurry vision | | | | | | | |
| (5) Have dimmed eyes | | | | | | | |
| (6) Have a double vision | | | | | | | |
| (7) Feel hot in the eyes | | | | | | | |
| (8) Have dry eyes | | | | | | | |
| (9) Have teary or watery eyes | | | | | | | |
| (10) Feel stimulation in the eyes | | | | | | | |
| (11) Have itchy eyes | | | | | | | |
| (12) Have flickering in the eyes | | | | | | | |
| (13) Feel dazzled | | | | | | | |
| (14) Color appears to be different | | | | | | | |
| (15) Have a headache | | | | | | | |

FIG. 8

[Table 3]

| | | Strongly disagree | Slightly disagree | Somewhat agree | Quite agree | Strongly agree |
|---|---|---|---|---|---|---|
| | 1. Feel heavy in the head | 1 | 2 | 3 | 4 | 5 |
| | 2. Feel irritated | 1 | 2 | 3 | 4 | 5 |
| ○ | 3. Have dry eyes | 1 | 2 | 3 | 4 | 5 |
| | 4. Feel sick | 1 | 2 | 3 | 4 | 5 |
| | 5. Feel restless | 1 | 2 | 3 | 4 | 5 |
| | 6. Have a headache | 1 | 2 | 3 | 4 | 5 |
| ○ | 7. Have sore eyes | 1 | 2 | 3 | 4 | 5 |
| | 8. Have neck and shoulder stiffness | 1 | 2 | 3 | 4 | 5 |
| | 9. Feel the brain muddled | 1 | 2 | 3 | 4 | 5 |
| | 10. Give a yawn | 1 | 2 | 3 | 4 | 5 |
| | 11. Have hand pain or finger pain | 1 | 2 | 3 | 4 | 5 |
| | 12. Feel dizzy | 1 | 2 | 3 | 4 | 5 |
| | 13. Feel sleepy | 1 | 2 | 3 | 4 | 5 |
| | 14. Feel lethargic | 1 | 2 | 3 | 4 | 5 |
| | 15. Have feelings of anxiety | 1 | 2 | 3 | 4 | 5 |
| ○ | 16. Have a blurry vision | 1 | 2 | 3 | 4 | 5 |
| | 17. Feel tired in the whole body | 1 | 2 | 3 | 4 | 5 |
| | 18. Feel depressed | 1 | 2 | 3 | 4 | 5 |
| | 19. Feel heavy in the arms | 1 | 2 | 3 | 4 | 5 |
| | 20. Have trouble thinking | 1 | 2 | 3 | 4 | 5 |
| | 21. Prefer to lie down | 1 | 2 | 3 | 4 | 5 |
| ○ | 22. Feel strained in the eyes | 1 | 2 | 3 | 4 | 5 |
| | 23. Have pain in the lower back | 1 | 2 | 3 | 4 | 5 |
| ○ | 24. Have bleary eyes | 1 | 2 | 3 | 4 | 5 |
| | 25. Feel heavy in the legs | 1 | 2 | 3 | 4 | 5 |

Blurriness: have bleary eyes, feel strained in the eyes, have sore eyes, have dry eyes, have a blurry vision

FIG. 9

[Table 4]

Visibility

Viewability of characters: 1. Very poor   2. Poor   3. Borderline   4. Good   5. Very good

LIGHT SOURCE, LED DEVICE, AND LIGHT EMITTING DISPLAY STRUCTURE

TECHNICAL FIELD

The present invention relates to a light source, an LED device, and a light emitting display structure that emit light that is less likely to cause fatigue.

BACKGROUND ART

Conventionally, lighting devices including an LED element taking wavelengths into account are known as lighting that reduces fatigue during operation, and improves the visibility. For example, PTL 1 listed below discloses, as a lighting device that outputs illumination light by emission of an LED element that can improve the comfort and reduce fatigue during operation, a lighting device wherein a spectrum of illumination light has an area at 600 nm to 700 nm of 30% or more and 70% or less, and an area at 400 nm to 500 nm of 20% or less, relative to the area at 400 nm to 800 nm of the spectrum of the illumination light, and the spectrum of the illumination light has a maximum value between 600 nm and 700 nm, and a maximum value of a spectrum of 500 nm to 600 nm is 70% or less relative to the maximum value.

PTL 2 listed below discloses, as a lighting device that can increase the whiteness and improve the visibility, while maintaining high color rendering, a lighting device including an LED light source including: an incandescent color LED being prescribed in JIS Z 9112 having a peak wavelength in the range of 580 nm to 630 nm and a half width at the peak wavelength in the range of 120 nm to 175 nm; a blue LED having a peak wavelength in the range of 450 nm to 480 nm; and a green LED having a peak wavelength in the range of 500 nm to 530 nm For example, PTL 3 listed below discloses, as an incandescent lamp, a fluorescent lamp, an LED lighting device, and a luminaire each having a light color with a high relaxation effect, an LED lighting device including two or more light-emitting diodes (LEDs), wherein one of the light-emitting diodes has a dominant wavelength emission band of 380 nm to 505 nm, and another one of the light-emitting diodes has a dominant wavelength emission band of 575 nm to 780 nm, and the chromaticity point of the color of the radiation light resulting from emission of the light-emitting diodes is present in a chromaticity region surrounded by a boundary line formed by connecting, by a straight line, (u', v')=(0.33, 0.485), (0.31, 0.517), (0.28, 0.51),(0.265, 0.5), (0.259, 0.491), (0.253, 0.465), and (0.305, 0.47) on a CIE 1976 u'v' chromaticity diagram.

CITATION LIST

Patent Literatures

[PTL 1] Japanese Laid-Open Patent Publication No. 2013-171689
[PTL 2] Japanese Laid-Open Patent Publication No. 2013-258037
[PTL 3] Japanese Laid-Open Patent Publication No. 2003-257224

SUMMARY OF INVENTION

Technical Problem

All of the above-described techniques are related to illumination light used when illuminating an object in an operating environment or a living environment, and an operation is performed while viewing the color of the object that is rendered by the light reflected from the object, and the techniques are not related to a lighting device whose light source itself is gazed at.

Conventionally, for a light source whose light is directly gazed at, for example, a light source for light emitting display, no studies have been conducted on light that has high visibility, is less likely to cause fatigue, and is perceived to be bright even in a dark place. Specifically, for a light emitting display structure, as is used, for example, in an instrument panel of an automobile, that provides light emitting display of characters, figures, or symbols in a background that has a low brightness or light-blocking properties, there has been concern that fatigue is accumulated by viewing the light emitting display. For a light emitting display structure such as an instrument panel of an automobile, light source that has visibility and reduces fatigue was not conventionally known.

It is an object of the present invention to provide a light source, an LED device, and a light emitting display structure that are perceived to be bright in a dark place, provide high visibility, and are less likely to cause fatigue.

Solution to Problem

An aspect of the present invention is directed to a light source that emits light, wherein, in coordinates in a CIE 1931 chromaticity diagram, the light has a color purity included in a region of 2 to 50 in a region surrounded by a line segment WB and a line segment WG that connect coordinates W (0.33, 0.33) indicating an achromatic color with coordinates B (0.091, 0.133) of 480 nm and coordinates G (0.373, 0.624) of 560 nm on a spectral locus, and the spectral locus, and has an area occupied by a continuous spectral wavelength in a wavelength region of 480 to 540 nm, of 15% or more, preferably 15 to 68%, relative to an area of an overall spectral wavelength of the light source at 380 to 780 nm. Such a light source emits light that is perceived to be bright in a dark place, provides high visibility, and is less likely to cause fatigue. To obtain the light source in such a region, it is possible to select a wavelength by combining, not only an LED device, but also an organic EL, a fluorescent lamp, or an incandescent lamp with a color filter as an element for adjusting the spectral wavelength.

It is preferable that the light source emits color having the color purity included in a region of 5 to 40, because this provides better visibility.

It is preferable that a spectral distribution of the light has an area of 15 to 30% at 380 to 480 nm, an area of 25 to 62% at 481 to 560 nm, an area of 9 to 35% at 561 to 640 nm, and an area of 1 to 10% at 641 to 780 nm, relative to an area of an overall spectral wavelength of the light source at 380 nm to 780 nm, because this provides better visibility.

It is preferable that, in a spectral distribution of the light, the light has a first peak indicating a maximum emission intensity in a range of 420 to 480 nm, and further has a second peak indicating an emission intensity of 40 to 65% in a range of 481 to 680 nm relative to the maximum emission intensity, because this provides better visibility. In this case, it is preferable that the light has, between the first peak and the second peak, a valley indicating an emission intensity of 18 to 40% relative to the emission intensity of the first peak, because this allows the light source to emit light that is further less likely to cause fatigue.

It is preferable that, in a spectral distribution of the light, the light has a ratio of an area at 481 to 560 nm to an area at 641 to 780 nm, of 2 to 4, because this provides better visibility.

It is preferable that the light source is an LED device including an LED element having an emission peak wavelength in a range of 420 to 480 nm, and at least one fluorescent substance selected from a YAG fluorescent substance having a fluorescence peak wavelength in a range of 520 to 590 nm and a green fluorescent substance having a fluorescence peak wavelength in a range of 470 to 560 nm, because this allows the above-described light source to be easily produced. In this case, it is preferable that the light source does not contain a red fluorescent substance having a fluorescence peak wavelength in a range of 600 to 780 nm, because this allows the light source to emit light that is particularly less likely to cause fatigue.

When the light source is an LED device, it is preferable that the LED device is an LED device with a fluorescent substance layer, the LED device including the LED element and a fluorescent substance layer that converts an emission wavelength of the LED element, and the fluorescent substance layer includes at least one fluorescent substance selected from the YAG fluorescent substance and the green fluorescent substance, because this provides excellent color reproducibility. In particular, it is preferable that the LED device includes an LED device body including the LED element and a transparent resin encapsulant that encapsulates the LED element, and the fluorescent substance layer that covers the transparent resin encapsulant, because this allows a general-purpose blue LED device to be used as the LED device body, and thus is cost effective.

The above-described light source can be preferably used as a light source for light emitting display.

Another aspect of the present invention is directed to a light emitting display structure including: a display portion; and a background portion around the display portion, wherein the display portion performs display by emission of any of the above-described light sources, and the display portion has a brightness that is higher than the brightness of the background portion by 30% or more. The brightness of the display portion is preferably within the range of 0.5 to 300 cd/m$^2$. Such a light emitting display structure exhibits a high contrast, is perceived to be bright in a dark place, has high visibility, and is less likely to cause fatigue, in the case of performing light emitting display of information such as characters, figures, symbols, and the like, such as in the case of an instrument panel.

It is more preferable that the background portion is a non-emitting portion, from the viewpoint of the visibility.

It is more preferable that the surface of the background portion is indirectly illuminated or directly illuminated, from the viewpoint of making the information displayed on the background portion to be easily viewed.

Another aspect of the present invention is directed to a light emitting display structure including: a display panel including a display portion including a light-transmitting portion for being displayed, and a light-blocking background portion that blocks light; and a backlight light source disposed on a side opposite to a display surface of the display panel, wherein the backlight light source is any of the above-described light sources. With such a light emitting display structure, in the case of providing light emitting display of characters, figures, symbols and the like in the display portion such as in the case of an instrument panel, high visibility can be easily maintained, regardless of the viewing angle, by forming the light emitting display structure such that the display portion and the background portion, which is non-emitting and light-blocking, are flushness with each other. Such a light emitting display structure can be preferably used as a backlight light source of a mobile phone, a liquid crystal display device, and the like.

The light emitting display structure can be preferably used as so-called lighted switch button, a meter, and an instrument panel having the light emitting display function that are provided in a controlling portion of a mobile object such as an automobile, a vessel, and an aircraft. As for the brightnesses of the light emitting display devices, the brightness is preferably 1 to 15 cd/m$^2$ for the lighted switch button, 20 to 200 cd/m$^2$ for the meter, and 100 to 200 cd/m$^2$ for the instrument panel. These are highly useful for an operator controlling or performing steering at night.

The above-described light sources can also be used as a light source that can adjust the fatigue. For example, the light source can be configured as a light source for inducing sleep or a light source for arousing the brain and the body by actively adjusting a red light component that cause fatigue or a blue light component. The light source can also be configured as a light source that is less likely to cause fatigue over an extended period of operation.

Advantageous Effects of Invention

According to the present invention, it is possible to obtain a light source, an LED device, and a light emitting display structure that emit light that is perceived to be bright in a dark place, provide high visibility, and are less likely to cause fatigue.

BRIEF DESCRIPTION OF DRAWING(S)

FIG. 6 is a top view of a backlight light source 101 that is to be accommodated in the light emitting display structure 100.

FIG. 7 is a table of items for evaluating subjective symptoms of eye strain.

FIG. 8 is a table of items for evaluating subjective symptoms of blurriness.

FIG. 9 is a table of criterion for evaluating visibility.

DESCRIPTION OF EMBODIMENTS

Hereinafter, preferred embodiments of a light source, an LED device, and a light emitting display structure according to the present invention will be described. The light source according to the present embodiment is a light source that emits light, wherein, in coordinates in a CIE 1931 chromaticity diagram, the light has a color purity included in a region of 2 to 50 in a region surrounded by a line segment WB and a line segment WG that connect coordinates W (0.33, 0.33) indicating an achromatic color with coordinates B (0.091, 0.133) of 480 nm and coordinates G (0.373, 0.624) of 560 nm on a spectral locus, and the spectral locus, and has an area occupied by a continuous spectral wavelength in a wavelength region of 480 to 540 nm, of 15% or more relative to an area of an overall spectral wavelength of the light source at 380 to 780 nm. The emission of such a light source is perceived to be bright in a dark place, has high visibility, and is less likely to cause fatigue. Note that the color coordinates of the light source are measured in accordance with JIS Z 8701, and measured, for example, using a spectral radiance luminance meter (CS-2000A manufactured by KONICA MINOLTA, INC).

Figure 1:
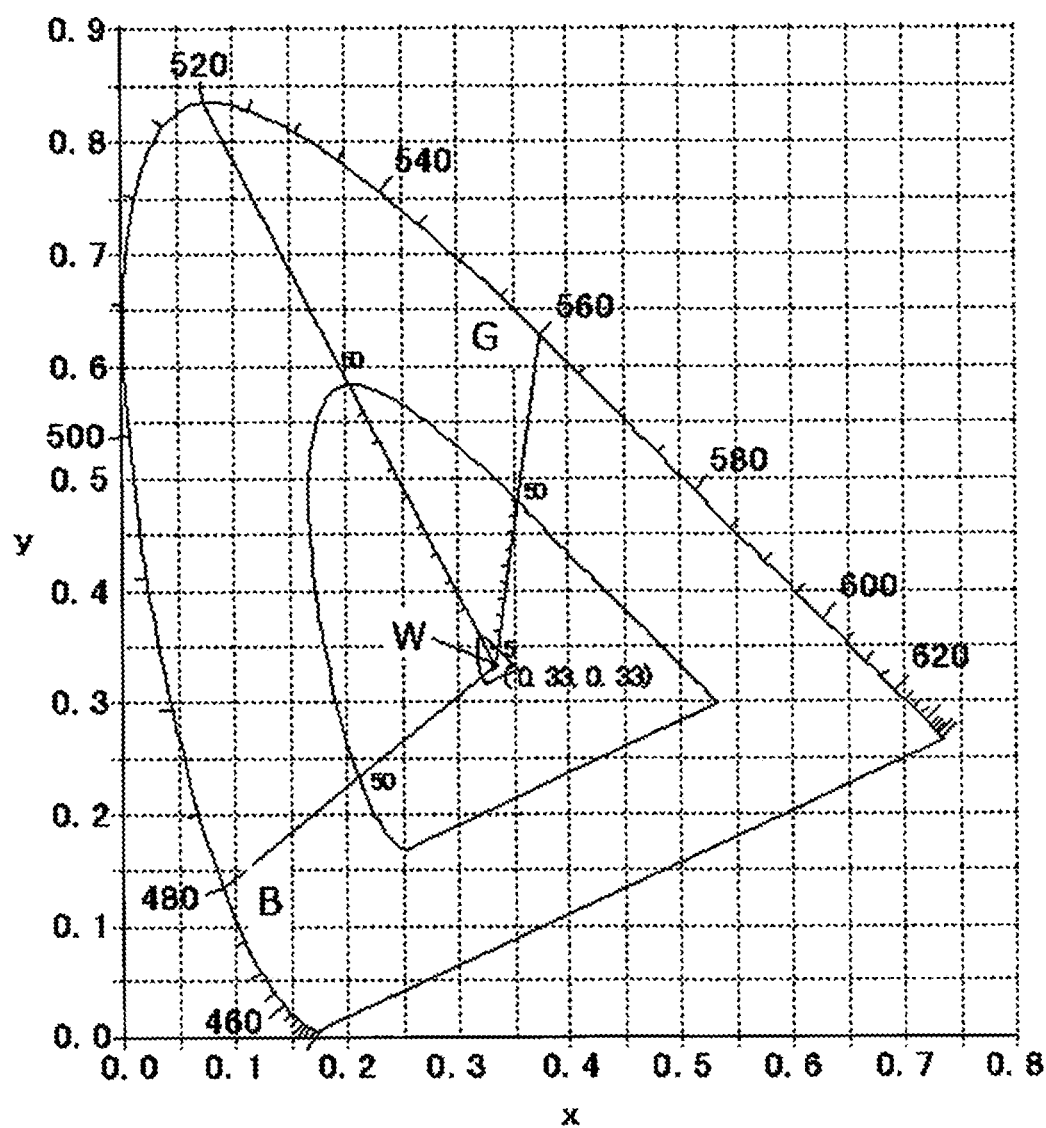
FIG. 1 is a CIE 1931 chromaticity diagram for illustrating an emission color of a light source according to an embodiment.

Here, referring to FIG. 1, a color purity of 50 represents the color on a locus formed by connecting points located at 50% of the length of line segments connecting coordinates W representing an achromatic color with points from coordinates B of 480 nm to coordinates G of 560 nm on a spectral locus, in coordinates in a CIE 1931 chromaticity diagram. Note that a color purity of 100 represents the color on the spectral locus. Likewise, other color purities represent colors on loci that form similar figures corresponding to the respective ratios relative to the spectral locus. When the color purity of the light source exceeds 50, the light source is less likely to cause fatigue, but has a reduced visibility. The color purity is preferably 5 to 40, and more preferably 5 to 20, because the light source exhibits a good balance between the unlikeliness of causing fatigue and the favorable visibility.

The scotopic standard spectral luminous efficiency is the spectral luminous efficiency defined by the International Commission on Illumination (CIE) as a world standard from the average of the human spectral luminous efficiencies in a dark place. In the present invention, from the viewpoint of the visibility, the light source is preferably a light source in which, in the scotopic standard spectral luminous efficiency, the area occupied by a continuous spectral wavelength of the light source in the wavelength region of 480 to 540 nm, in which the luminous efficiency is high, is 15% or more, preferably 18% or more, relative to the overall spectral wavelength region of 380 to 780 nm of the light source, because the light source is perceived to be bright in a dark place. Note that the upper limit is preferably 68%, and more preferably 51%.

The spectral distribution of the light emitted by the light source according to the present embodiment has, in a continuous spectrum constructed by plotting wavelengths along a horizontal axis and relative emission intensities along a vertical axis, an area at 380 to 480 nm of preferably 15 to 30%, more preferably 24 to 27%, an area at 481 to 560 nm of preferably 25 to 62%, more preferably 30 to 35%, an area at 561 to 640 nm of preferably 9 to 35%, more preferably 30 to 33%, and an area at 641 to 780 nm of preferably 1 to 10%, more preferably 5 to 10%, relative to the area at 380 nm to 780 nm in a wavelength region of 380 nm to 780 nm. As a result of intensive studies conducted by the present inventors, surprisingly, it was found that a light source that emits such light exhibits a better balance between the unlikeliness of causing fatigue and the favorable visibility. The region of 380 to 480 nm is an ultraviolet to blue wavelength region, the region of 481 to 560 nm is a green wavelength region, the region of 561 to 640 nm is a yellow wavelength region, and the region of 641 to 780 nm is a red to infrared wavelength region.

Furthermore, in the above-described spectral distribution, the light has a ratio of the area at 481 to 560 nm to the area at 641 to 780 nm, of preferably 2 to 4, because this provides a particularly good visibility. When the ratio of the area at 481 to 560 nm to the area at 641 to 780 nm is too small, the effect of being less likely to cause fatigue tends to be reduced. When the area ratio is too large, the visibility tends to be reduced.

It is preferable that, in a spectral distribution of the light, the light has a first peak indicating a maximum emission intensity in a range of 420 to 480 nm, and further has a second peak indicating an emission intensity of 40 to 65% in a range of 481 to 680 nm relative to the maximum emission intensity. When the emission intensity of the second peak is excessively lower than that of the first peak, the bluishness tends to be increased. When it is excessively higher, the whiteness tends to be decreased.

It is preferable that, in a spectral distribution of the light, the light has, between the first peak and the second peak, a valley indicating an emission intensity of 18 to 40% relative to the emission intensity of the first peak. When the emission intensity of the valley between the first peak and the second peak is too low, the effect of being less likely to cause fatigue tends to be reduced. When the emission intensity of the valley between the first peak and the second peak is too high, the effect of being less likely to cause fatigue is improved, but instead, the visibility tends to be reduced. Additionally, the production tends to be difficult.

Hereinafter, a light source using an LED device will be described in detail as an representative example of the light source according to the present embodiment. Although a light source using an LED device will be described in detail in the present embodiment, the configuration of the light source is not limited to those using an LED device. The emission of an organic EL, a fluorescent lamp, an incandescent lamp, or the like may be combined with a color filter or the like as an element for adjusting the spectral wavelength. The LED device is preferable in that it does not take up much space due to its size and thus is easy to handle, and that the spectral distribution of the light source can be adjusted by adjusting the fluorescent substance. In the LED device, the fluorescent substance may adjust the spectral distribution of the light source in a blue LED device including only a blue LED chip, or in an LED chip such as a 3-in-1 LED including a plurality of elements, for controlling the emission peak intensity for adjusting the spectral distribution of the light source.

Figure 2A:
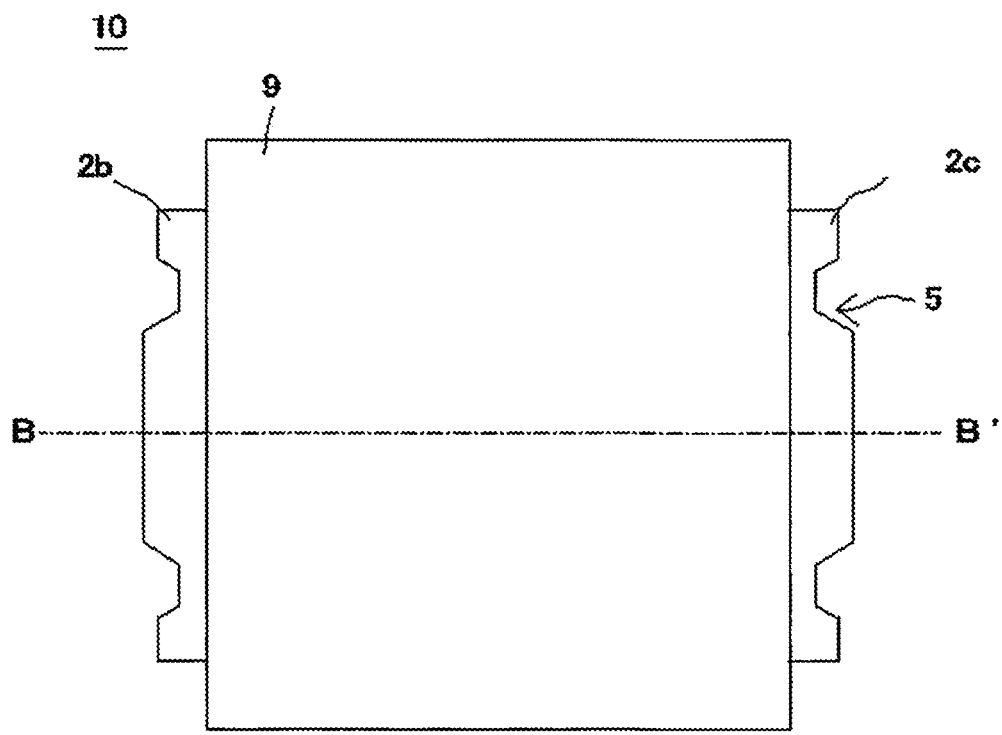
FIG. 2A is a schematic plan view of an LED device 10 according to an embodiment.
Figure 2B:
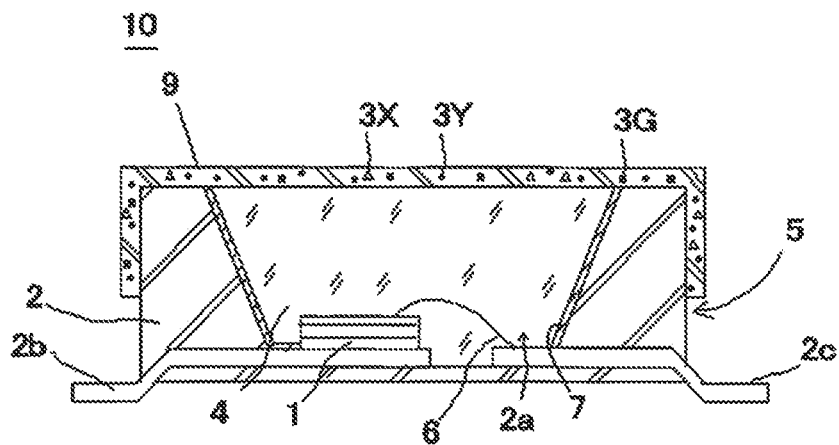
FIG. 2B is a cross-sectional view taken along the line B-B' in FIG. 2A.

FIG. 2A is a schematic plan view of an LED device 10 according to the present embodiment. FIG. 2B is a cross-sectional view taken along the line B-B' in FIG. 2A. As shown in FIGS. 2A and 2B, the LED device 10 according to the present embodiment is a construct formed so as to cover an LED device body 5 by a fluorescent substance cap 9 that is a fluorescent substance sheet (fluorescent substance layer) containing fluorescent substances 3 (3Y, 3G) and another light color adjuster 3X that is blended as needed.

As shown in FIG. 2B, the LED device body 5 is a so-called packaged LED light emitting device body including a blue LED element 1 having an emission peak wavelength in the range of 420 to 480 nm, a package member 2 including an accommodating recess 2a that accommodates the blue LED element 1, and a transparent resin encapsulant 4 that encapsulates the blue LED element 1 accommodated in the accommodating recess 2a. A reflection film 7 that is silver plating is formed on an inner side surface of the accommodating recess 2a. One electrode of the blue LED element 1 is connected to a lead 2b, the other electrode of the blue LED element 1 is connected to a lead 2c by being wire-bonded with a gold wire 6, and the leads 2b and 2c are extended to the outside. In such an LED device body 5, the upper surface of the transparent resin encapsulant 4 serves as an emission surface. Also, the fluorescent substance cap 9 is attached as a fluorescent substance layer so as to cover the emission surface on the upper surface of the transparent resin encapsulant 4 of the LED device body 5.

The blue LED element 1 is a blue LED chip having an emission peak wavelength in a blue region of 420 nm to 480 nm. Specific examples of the blue LED element include elements such as a GaN-based element. The transparent resin encapsulant 4 encapsulates and seals the blue LED element 1 accommodated in the accommodating recess 2a. Examples of the transparent resin that forms the transparent resin encapsulant include a silicone resin, an epoxy resin, and an acrylic resin. The LED device body according to the present embodiment includes so-called bullet type, packaged type, chip-on-board (COB) type, and the like, and it is possible to use LED device bodies in any form as long as they include an LED element having an emission peak at 420 nm to 480 nm.

The fluorescent substance cap 9 is a molded body obtained by molding, into a cap shape, a fluorescent substance sheet in which at least one fluorescent substance selected from a YAG fluorescent substance 3Y having a fluorescence peak wavelength in the range of 520 to 590 nm, and a green fluorescent substance 3G having a fluorescence peak wavelength in the range of 470 to 560 nm, and another light color adjuster 3X that is blended as needed are blended in an optically transmissive resin. Specific examples of the optically transmissive resin include a silicone rubber (silicone elastomer) and a silicone resin. In particular, a millable silicone rubber, a millable silicone elastomer, and a millable silicone resin are more preferable than a liquid silicone rubber (silicone elastomer) and a liquid silicone resin, because particles of the fluorescent substance, another light color adjuster, or a plurality of different fluorescent substance particles contained in the fluorescent substance layer do not precipitate due to their differences in specific gravity or particle diameter, so that a fluorescent substance layer with good particle dispersibility can be obtained. Although the fluorescent substance layer is a cap-shaped fluorescent substance cap, the fluorescent substance layer may have a flat sheet shape instead of being the fluorescent substance cap, and may be spaced from or in close contact with the LED device body. The fluorescent substance layer may be in the form of a film that is formed on the surface of the blue LED chip, or formed inside or on the surface of the transparent resin encapsulant 4. In particular, it is preferable that the fluorescent substance layer is in the form of a film that is formed on the surface of the transparent resin encapsulant 4, because this facilitates the adjustment of the amounts of the fluorescent substance and the light color adjuster blended in the fluorescent substance layer, the fine adjustment of the spectral wavelength or the emission intensity, or the production of the LED device.

The YAG fluorescent substance 3Y is excited by the emission of the blue LED element 1, to emit yellow light having a peak wavelength in the range of 520 to 590 nm. The green fluorescent substance 3G is excited by the emission of the blue LED element 1, to emit green light having a peak wavelength in the range of 470 to 560 nm. Specific examples of the green fluorescent substance include a silicate-based green fluorescent substance, a LuAG-based green fluorescent substance, an aluminate-based green fluorescent substance, and a sialon-based green fluorescent substance such as β-SiAlON:Eu. When the average particle size of the YAG fluorescent substance 3Y and the green fluorescent substance 3G is smaller than 3 μm, particles are likely to agglomerate, so that the particle dispersibility tends to be reduced. When the average particle size of the YAG fluorescent substance 3Y and the green fluorescent substance 3G is larger than 20 μm, the fine adjustment of the spectral wavelength or the emission intensity tends to be difficult. The average particle size of the YAG fluorescent substance 3Y and the green fluorescent substance 3G is preferably in the range of 3 to 20 μm. The fluorescent substance particles of the YAG fluorescent substance 3Y and the green fluorescent substance 3G may be subjected to surface treatment, thus improving the affinity with a silicone rubber, a silicone elastomer, or a silicone resin, or adjusting the peak wavelength or the emission intensity of the fluorescent substances.

In order to adjust the emission color of the LED device 10 and the spectrum of the light emitted thereby, a light color adjuster 3X other than the fluorescent substances 3 (3Y, 3G) may be blended as needed in, the fluorescent substance cap 9. Examples of the light color adjuster 3X include a red fluorescent substance that is excited by the emission of the blue LED element 1, to emit red light having a peak wavelength in the range of 600 to 780 nm. Although the red fluorescent substance may be used for controlling the shape of the curve of the wavelength region of 650 nm or more in order to increase the color rendering, the use of the red fluorescent substance tends to result in light that is likely to cause fatigue. Therefore, it is preferable that the red fluorescent substance is not contained, or contained at a low content ratio, from the viewpoint of reduced fatigue. Specific examples of the red fluorescent substance include a nitride-based red fluorescent substance, a silicate-based red fluorescent substance, a CASN-based red fluorescent substance such as $CaAlSiN_3$:Eu, and a sialon-based red fluorescent substance.

Examples of the light color adjuster 3X also include a colorant. The colorant does not emit fluorescent light, and is used as a component for adjusting the emission color by absorbing light of a predetermined wavelength. Specific examples of such a colorant include, for example, as green pigments, organic or inorganic pigments such as chromium green, chromium oxide, pigment green B, malachite green lake, final yellow green G, and phthalocyanine green. These materials may be mixed with the fluorescent substance blended in the fluorescent substance layer, or may be used in the form of a layer separately from the fluorescent substance layer.

In order to regulate the overall brightness of the light source, it is also possible to use a white pigment such as titanium oxide, talc, or barium sulfate, and a black pigment such as carbon black. It is also possible to use silica, calcium carbonate, or the like as a light diffusing material. These materials may be mixed with the fluorescent substance blended in the fluorescent substance layer, or may be used in the form of a layer separately from the fluorescent substance layer.

As an embodiment of the present invention, an example in which a cap containing fluorescent substances is used so as to be placed on an LED light emitting device was described; however, the LED device may be formed by using an LED element having an emission peak at 420 nm to 480 nm, placing a fluorescent substance sheet containing fluorescent substances on the LED element, and encapsulating the LED element and the fluorescent substance sheet by an encapsulant.

Such a light source according to the present embodiment is particularly preferably used in applications where light emission display for displaying information such as characters, figures, symbols, and the like with light is performed, in which emitted light directly enters the eyes.

This light source is a light source suitable for light emitting display. The light source includes, as a light emitting display structure, a display portion, and a background portion other than the display portion, wherein the display portion is displayed by the light source.

Figure 5A:
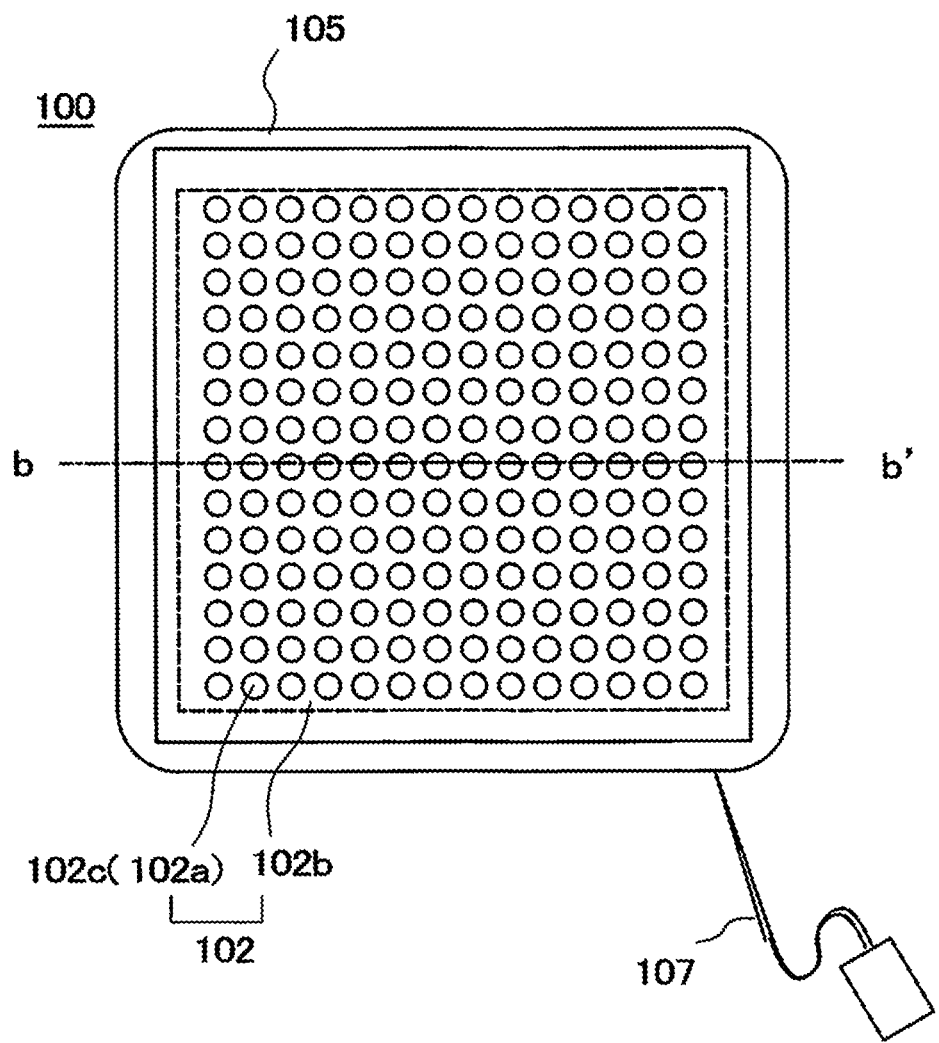
FIG. 5A is a plan view of a light emitting display structure 100 according to an embodiment.
Figure 5B:
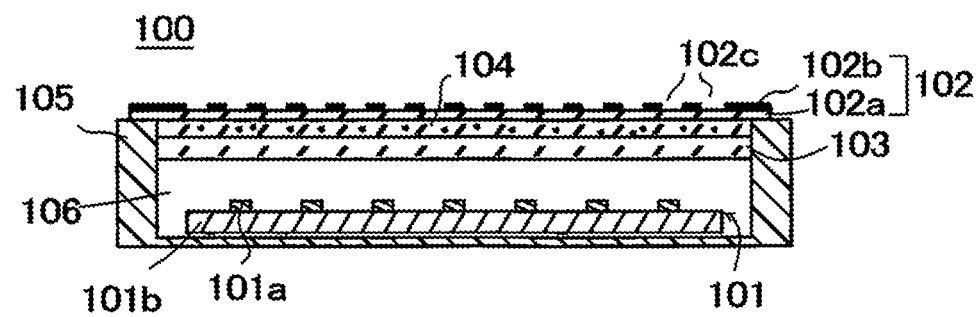
FIG. 5B is a schematic cross-sectional view taken along the line b-b' in FIG. 5A.

FIG. 5A is a schematic top view of a light emitting display structure 100, which is an example of the light emitting display structure according to the present embodiment, that uses a plurality of light sources 101a that are LED devices. FIG. 5B is a schematic cross-sectional view taken along the line b-b' in FIG. 5A. FIG. 6 is a top view of a backlight light source 101 that is to be accommodated in the light emitting display structure 100.

In FIGS. 5A and 5B, 101 denotes a backlight light source formed by mounting a plurality of light sources 101a on a circuit board 101b, 102 denotes a display panel, 102a denotes a light-transmitting transparent plate including a light-blocking portion, 102b denotes a light-blocking portion that blocks light, 102c denotes a display portion, 103 denotes a transparent light guide plate, 104 denotes a light diffusion plate (light diffusion layer), 105 denotes a casing, 106 denotes a light source accommodating portion, and 107 denotes a socket-equipped code for supplying power to the backlight light source 101.

As shown in FIG. 6, the backlight light source 101 of the light emitting display structure 100 is mounted such that the plurality of light sources 101a are arranged regularly on a circuit (not shown) formed on the circuit board 101b.

The brightness of the light emitted by the backlight light source is not particularly limited. For example, when the external environment is dark, or when a backlight light source configured to perform light emitting display in a dark environment, such as a speedometer installed in a vehicle, is assumed, the brightness is preferably in the range of 0.5 to 300 cd/m².

The transparent light guide plate 103 is formed of a transparent resin plate or a transparent glass plate, and the light diffusion plate 104 is stacked on the upper surface thereof. The transparent light guide plate 103 on which the light diffusion plate 104 is stacked serves as an optically transmissive table on which the display panel 102 is placed, and also has the function of suppressing a nonuniformity in brightness of the emission from the backlight light source by utilizing the light diffusion effect of the light diffusion plate, thus diffusing the emission such that uniform light is emitted from the upper surface. The material, thickness, shape, and the like of the light diffusion plate are not limited as long as the light diffusion plate has the function of diffusing light.

The display panel 102 is formed by forming, on the surface of a transparent plate 102a made of, for example, a transparent resin plate or a transparent glass plate, a light-blocking background portion 102b made of a light-blocking film printed with a light-blocking ink on a portion other than a portion for displaying, for example, characters, figures, symbols, or a combination thereof. On the other hand, a display portion, which is the portion for displaying characters, figures, symbols, or a combination thereof, preferably has a high light transmittance.

Preferably, light is output in a state in which the display portion has a brightness higher than the brightness of the background portion by 30% or more. Although the background portion may or may not emit light, it is more preferable that the background portion does not emit light. Furthermore, it is preferable that the color of the background portion is black or a black-based color.

When the background portion is non-emitting, it is necessary to put some associated information such as markings in the background portion, and therefore the surface of the background portion may be indirectly illuminated or directly illuminated if desired.

With such a light emitting display structure, when performing light emitting display of characters, figures, or symbols in the background, such as in the case of an instrument panel, the display portion and the non-emitting and light-blocking background portion are flushness each other in the light emitting display structure, so that the shape of the light emitting display structure is not complicated, and high visibility can be easily maintained.

The light emitting display structure may be a structure in which the background portion is in the form of a disk that does not emit light, and the display portion that involves light emission is disposed on the background portion. Some markings or symbols are described in the background portion as needed, and the light emitting display portion may be rotatable, or linearly or arcuately movable so as to indicate the reading of the markings.

Preferably, the light emitting display structure is used for so-called lighted switch, lighted button, meter, and display panel, each of which is arranged in an automatic control room or the like in which an operator performs a monitoring operation and that is provided with a light emitting display function, as well as for an instrument panel of a controlling portion of mobile objects including automobiles, aircrafts, vessels, and motorcycles. In particular, the light emitting display structure is useful for an instrument panel of automobiles, aircrafts, vessels, and the like that require controlling or steering operation for a long period of time under a night-time dark environment.

The light source can also be used as a light source capable of adjusting the fatigue. For example, the light source can be configured as a light source for inducing sleep or a light source for arousing the brain and the body by actively adjusting a red light component that cause fatigue or a blue color component. The light source can also have a wavelength distribution that is less likely to cause fatigue over an extended period of operation.

EXAMPLES

Hereinafter, the present invention will be described more specifically by way of examples. It should be appreciated that the scope of the present invention is by no means limited by the examples.

First, cap-equipped LED devices of Examples 1 to 9 and Comparative Examples 1 to 6 and 8, as a backlight light source used in a character presentation device corresponding to a light emitting display structure, will be collectively described below.

Figure 3A:
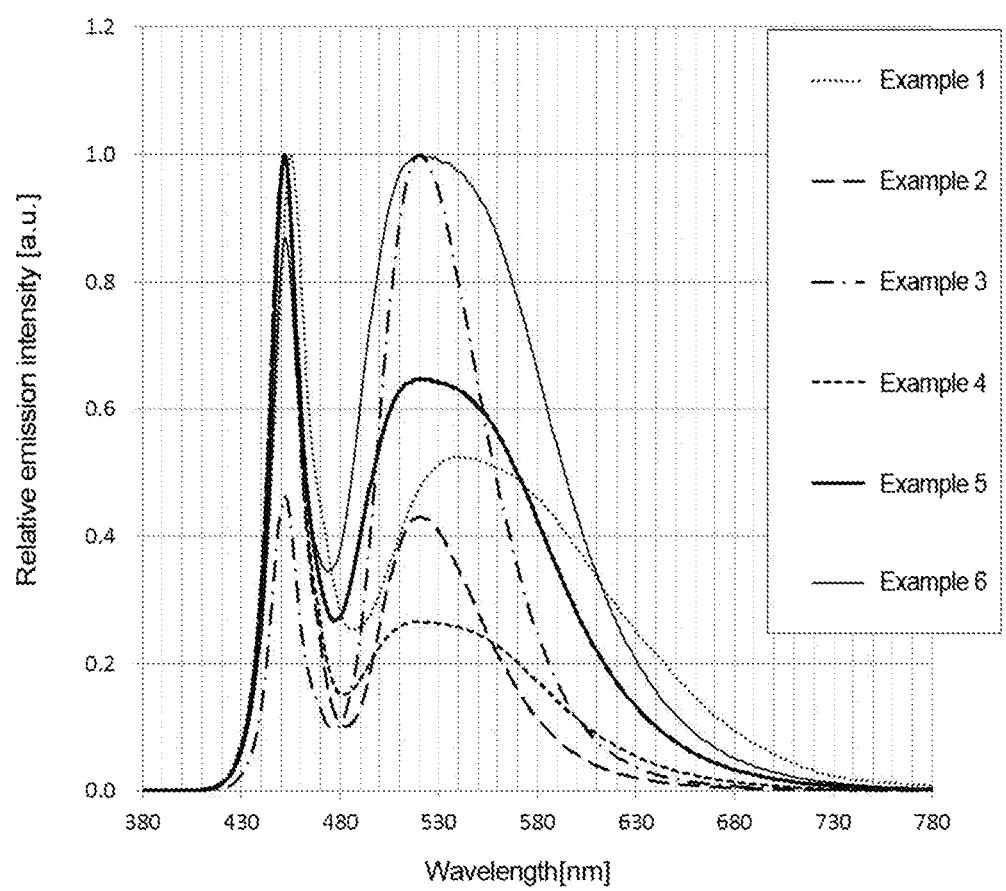
FIG. 3A shows a part of spectral distributions of cap-equipped LED devices with the respective fluorescent substances placed thereon, at the points represented on the CIE 1931 chromaticity diagram in FIG. 4.
Figure 3B:
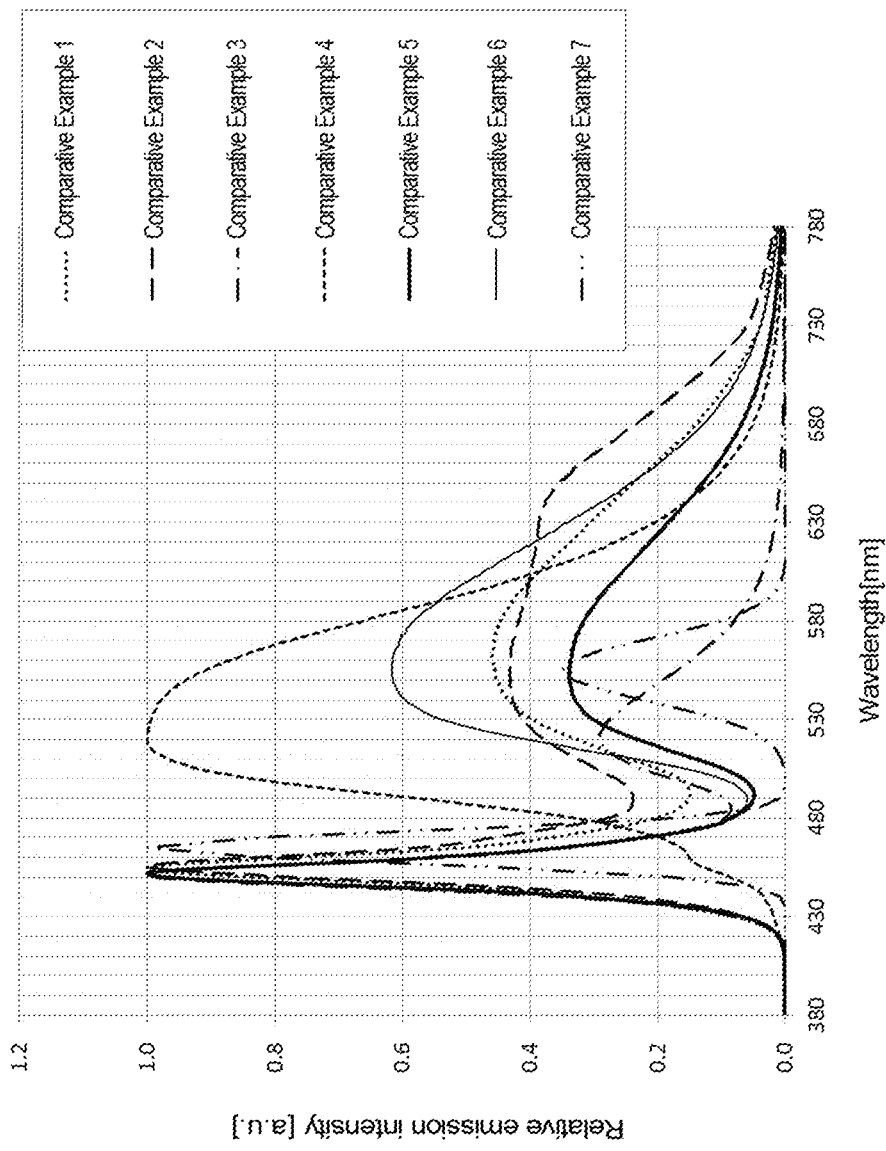
FIG. 3B shows a part of spectral distributions of cap-equipped LED devices with the respective fluorescent substances placed thereon, at the points represented on the CIE 1931 chromaticity diagram in FIG. 4.
Figure 3C:
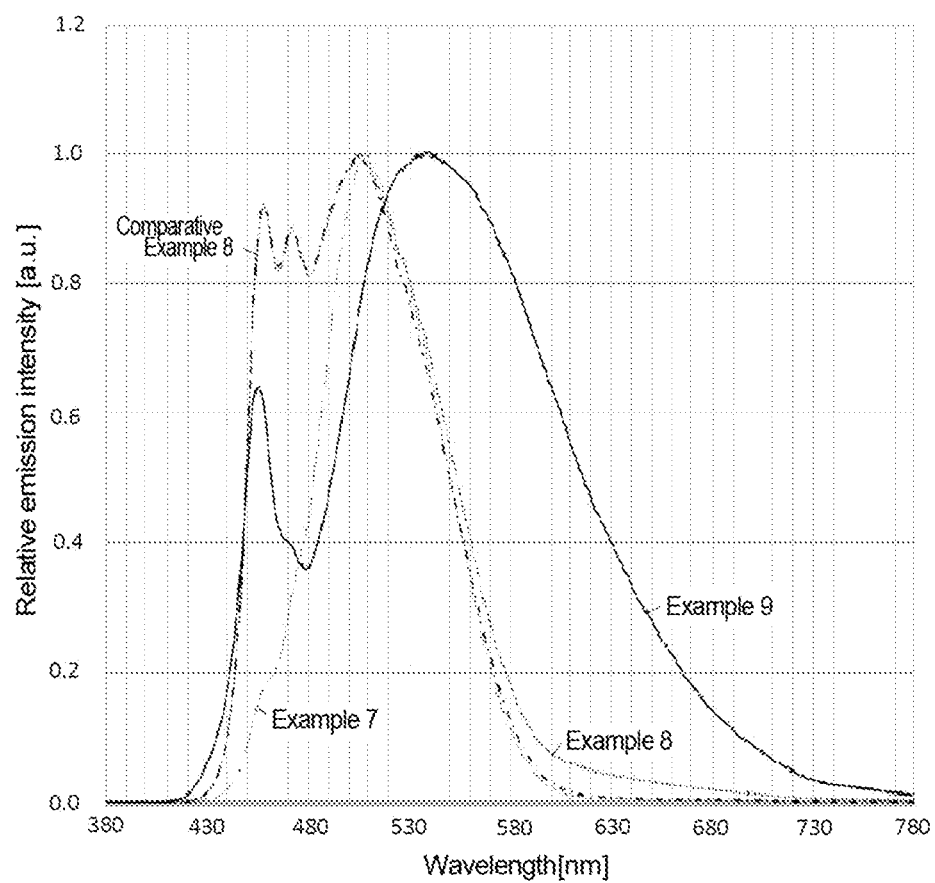
FIG. 3C shows a part of spectral distributions of cap-equipped LED devices with the respective fluorescent substances placed thereon, at the points represented on the CIE 1931 chromaticity diagram in FIG. 4.
Figure 4:
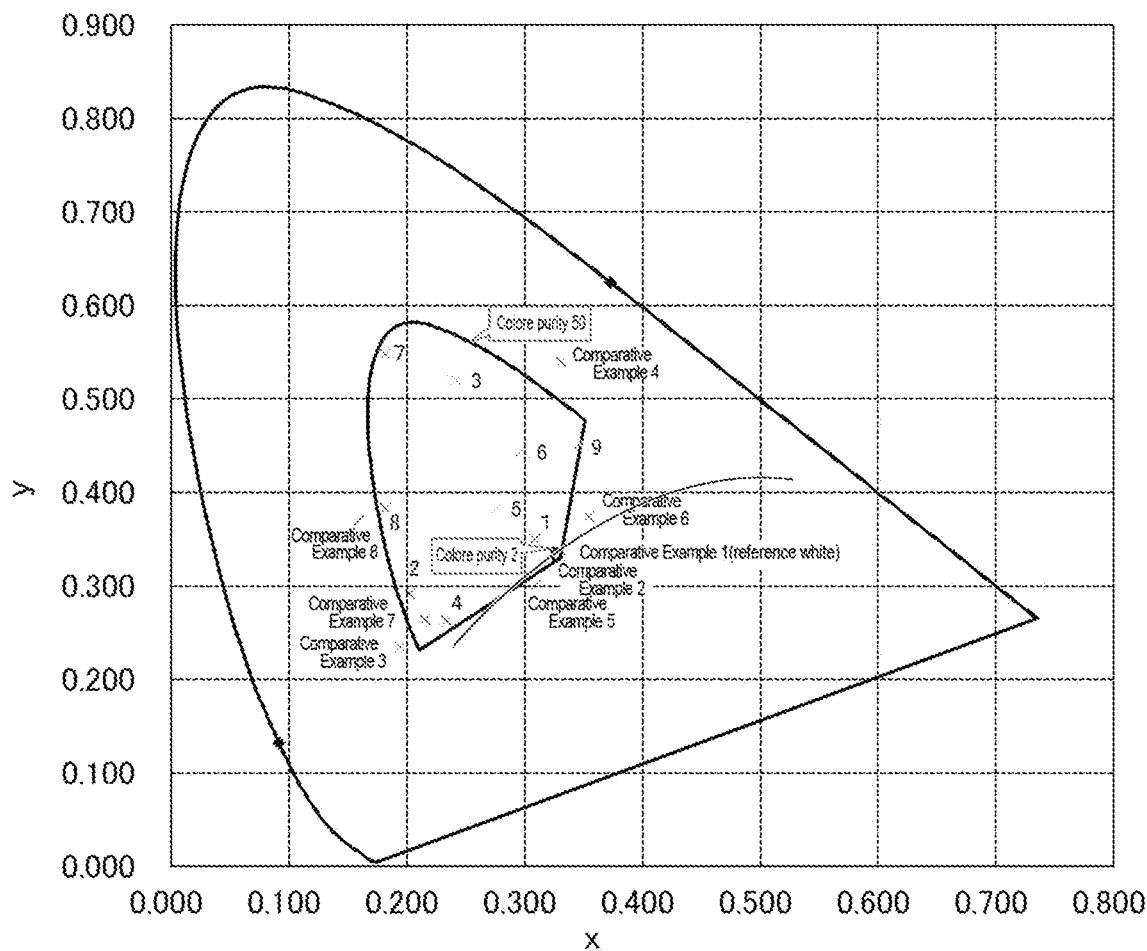
FIG. 4 shows coordinates on the CIE 1931 chromaticity diagram of emission colors of cap-equipped LED devices with the respective fluorescent substance caps placed thereon that were obtained in the examples.

The cap-equipped LED devices of Examples 1 to 9 and Comparative Examples 1 to 6 and 8 were produced by placing various fluorescent substance caps on a blue LED device body. As the blue LED device body, a blue LED device ("NSSC063A" manufactured by NICHIA CORPORATION) was used that had a peak wavelength of 450 nm and an emission spectrum in the range of wavelengths of 435 to 480 nm, and that emitted blue light located at color coordinates (0.143, 0.033). As the fluorescent substance cap, fluorescent substance caps were used that had a thickness of 0.3 mm and that had been obtained by dispersing, in a silicone rubber, a YAG fluorescent substance ("YAG fluorescent substance (peak wavelength: 555 nm)" manufactured by NICHIA CORPORATION), a green fluorescent substance ("silicate-based fluorescent substance (peak wavelength: 520 nm)" manufactured by NICHIA CORPORATION), a "LuAG-based fluorescent substance (peak wavelength: 525 nm)", a red fluorescent substance ("CASN-based fluorescent substance (peak wavelength: 630 nm)" manufactured by NICHIA CORPORATION) at predetermined blending ratios, and light sources having emission characteristics shown in Table 1 were obtained. Table 1 shows the emission characteristics of the cap-equipped LED devices with the respective fluorescent substance caps placed thereon. FIGS. 3A, 3B, and 3C show the spectra of the cap-equipped LED devices with the respective fluorescent substance caps placed thereon. FIG. 4 shows the coordinates on the CIE 1931 chromaticity diagram of the emission colors of the cap-equipped LED devices with the respective fluorescent substance caps placed thereon.

Comparative Example 7 is an example in which a light source having the emission characteristics shown in Table 1 was obtained using a light source formed by combining a "blue LED (465 nm)" manufactured by NICHIA CORPORATION and "SM0805BGC (550 nm)" manufactured by BIVAR, inc. The spectrum of the combined-wavelength LED device of Comparative Example 7 is also shown in FIG. 3A. The coordinates on the CIE 1931 chromaticity diagram of the emission color of the combined-wavelength LED device of Comparative Example 7 are also shown in FIG. 4.

Note that the emission spectra were measured using a spectral radiance luminance meter (CS-2000A manufactured by KONICA MINOLTA, INC).

TABLE 1

| Example No. | CIE chromaticity diagram coordinates (x, y) | Color purity (%) | Peak wavelength (nm) | Dominant wavelength (nm) | Wavelength distribution area ratio (%) (i) 380-480 (nm) | (ii) 481-560 (nm) | (iii) 561-640 (nm) | (iv) 641-780 (nm) | (ii)/(iv) | Scotopic wavelength area ratio (%) 480-540 (nm) S | $\lambda p2/\lambda p1$ (%) | $\lambda v/\lambda p1$ (%) | fluorescent substance | Evaluation results (1) | (2) | (3) | (4) | (5) |
|---|---|---|---|---|---|---|---|---|---|---|---|---|---|---|---|---|---|---|
| 1 | (0.309, 0.351) | 7.4 | 455.0 | 501.3 | 26.2 | 34.3 | 30.1 | 9.4 | 3.65 | 18.9 | 52.0 | 25 | YAG, green fluorescent substance (LuAG-based) | A | A | B | A | A |
| 2 | (0.203, 0.292) | 47.3 | 452.0 | 487.3 | 42.1 | 45.5 | 11.3 | 1.0 | 45.50 | 28.1 | 43.0 | 10 | Green-fluorescent substance (silicate-based) | B | B | B | A | B |
| 3 | (0.241, 0.520) | 37.4 | 521.0 | 521.5 | 13.4 | 69.3 | 16.3 | 1.1 | 63.00 | 42.2 | 217.4 | 22 | Green fluorescent substance (silicate-based) | B | B | B | B | A |
| 4 | (0.234, 0.263) | 39.8 | 452.0 | 481.8 | 43.4 | 35.6 | 18.3 | 2.8 | 12.71 | 21.7 | 27.0 | 15 | Green fluorescent substance (LuAG-based) | B | B | B | A | B |
| 5 | (0.276, 0.382) | 17.7 | 452.0 | 503.3 | 24.9 | 46.8 | 24.6 | 3.7 | 12.65 | 28.1 | 65.0 | 27 | Green fluorescent substance (LuAG-based) | B | A | B | A | A |
| 6 | (0.297, 0.443) | 24.2 | 520.0 | 533.6 | 16.8 | 51.7 | 27.4 | 4.0 | 12.93 | 30.9 | 114.9 | 40 | Green fluorescent substance (LuAG-based) | B | B | B | A | A |
| 7 | (0.181, 0.548) | 48.9 | 509.0 | 511.9 | 11 | 80.8 | 7.8 | 0.4 | 194.87 | 67.20 | — | — | Green fluorescent substance (LuAG-based) | B | B | B | A | B |

TABLE 1-continued

| Example No. | CIE chromaticity diagram coordinates Chromaticity (x, y) | Color purity (%) | Wavelength Peak wavelength (nm) | Wavelength Dominant wavelength (nm) | Wavelength distribution area ratio (%) (i) 380-480 (nm) | (ii) 481-560 (nm) | (iii) 561-640 (nm) | (iv) 641-780 (nm) | (ii)/(iv) | Scotopic wavelength area ratio (%) 480-540 (nm) S | λp2/λp1 (%) | λv/λp1 (%) | fluorescent substance | Evaluation results (1) | (2) | (3) | (4) | (5) |
|---|---|---|---|---|---|---|---|---|---|---|---|---|---|---|---|---|---|---|
| 8 | (0.189, 0.384) | 45.8 | 507.0 | 496.7 | 27.4 | 61.3 | 9.5 | 1.8 | 33.91 | 50.90 | — | — | Green fluorescent substance (LuAG-based) | B | B | B | A | A |
| 9 | (0.346, 0.456) | 40.8 | 540.0 | 558.7 | 12.6 | 43.7 | 34.2 | 9.4 | 4.63 | 30.70 | — | 56.3 | YAG, Green fluorescent substance (LuAG-based) | B | B | B | B | A |
| Com. Ex. 1 (reference white) | (0.330, 0.330) | 1.5 | 454.0 | 476.1 | 26.4 | 26.5 | 32.8 | 14.3 | 1.85 | 12.8 | 46.0 | 15 | YAG | — | — | — | — | — |
| Com. Ex. 2 | (0.331, 0.330) | 1.9 | 456.0 | 481.1 | 23.7 | 26.4 | 30.1 | 19.7 | 1.34 | 14.7 | 43.0 | 24 | YAG, green fluorescent substance (LuAG-based), red fluorescent substance | A | B | C | C | C |
| Com. Ex. 3 | (0.194, 0.234) | 56.0 | 451.0 | 481.7 | 51.4 | 37.9 | 9.7 | 1.0 | 37.90 | 23.5 | 29.0 | 8 | Green fluorescent substance (silicate-based) | C | C | B | A | B |
| Com. Ex. 4 | (0.331, 0.540) | 62.0 | 521.0 | 553.8 | 5.6 | 58.6 | 31.2 | 4.6 | 12.74 | 34.8 | 666.7 | — | Green fluorescent substance (LuAG-based) | C | C | B | B | A |
| Com. Ex. 5 | (0.309, 0.301) | 11.5 | 452.0 | 469.4 | 33.0 | 25.3 | 31.4 | 10.3 | 2.46 | 10.4 | 34.0 | 5 | YAG | B | C | B | B | B |
| Com. Ex. 6 | (0.355, 0.374) | 18.6 | 452.0 | 570.5 | 21.2 | 28.6 | 37.6 | 12.5 | 2.29 | 11.1 | 62.0 | 6 | YAG | B | C | B | B | B |
| Com. Ex. 7 | (0.216, 0264) | 46.0 | 465.0 | 484.0 | 58.1 | 31.3 | 18.0 | 0 | — | 12.2 | 35.0 | 0.08 | — | C | B | B | B | C |
| Com. Ex. 8 | (0.169, 0.375) | 53.2 | 506.0 | 494.9 | 29.4 | 63.7 | 6.5 | 0.4 | 151.0 | 53.6 | — | — | Green fluorescent substance (LuAG-based) | B | C | C | A | A |

(1) Visibility
(2) Subjective symptoms of eye strain
(3) Subjective symptoms of blurriness
(4) Critical fusion frequency determined by digital flicker value measurement
(5) NIRS (change in oxyl-lb amount)

Next, a character presentation device using each of the cap-equipped LED devices shown in Table 1, as the backlight light sources, will be described. In Table 1, assuming that the area of the spectral wavelength at 380 to 780 nm is 100, S represents the ratio of the area occupied by a continuous spectral wavelength in the wavelength region of 480 to 540 nm, in which the luminous efficiency is high on a scotopic standard spectral luminous efficiency curve. In addition, λp1 represents the emission intensity of a first peak indicating a maximum emission intensity in the range of 420 to 480 nm, λp2 represents the emission intensity of a second peak indicating an emission intensity of 40 to 65% in the range of 481 to 680 nm relative to the maximum emission intensity, and Xv represents the emission intensity indicating a valley between the first peak and the second peak.

A trace table (picture tracer PT404 W manufactured by Too Corporation) having an emission surface for A4-size paper in accordance with the JIS standard was prepared. Then, the LED light source that was a backlight light source equipped inside the trace table as standard equipment was removed, and, as a replacement thereof, each of the above-described cap-equipped LED devices was mounted. The brightness of each of the trace tables was adjusted to 30 cd/m$^2$, assuming meter lighting.

On the other hand, a light-blocking black coating material was applied to a soda glass plate having a thickness of 2 mm, to form a light-blocking film. On the formed light-blocking film, a Japanese text including 54 columns and 45 lines was engraved in MS Gothic characters with a font size of 10.5 by laser processing, to remove the light-blocking film located at the character portion, thus forming a character light-transmitting portion that emits light from the character portion. Then, the glass plate in which the character light-transmitting portion had been formed was placed on the emission surface of the above-described trace table, whereby a character presentation device was produced.

Then, with the use of the above-described character presentation device using each of the cap-equipped LED devices as the backlight light source, the character visibility and the fatigue when the characters of the Japanese text were read by test subjects were evaluated by the following methods. Note that the test subjects were not informed of the purpose of the test.

The test subjects were ten males at the age of 21 to 24. In addition, all of the test subjects had a binocular visual acuity of greater than or equal to 1.0 with the naked eyes, or when wearing normal eyeglasses or contact lenses, and also did not have any color-vision deficiency. The test subjects who wore normal eyeglasses or contact lenses were subjected to the test while wearing them.

<Text Overview>

The test was carried out in the following sequence. A character presentation device using each of the above-described LED devices as a backlight light source was prepared. A pair of a desk and a chair was disposed in a laboratory, and each test subject was seated in the chair. The test subject was made to answer questionnaires on subjective symptoms of eye strain, and a subjective symptom survey. First, the test subject was seated in the chair in a dark room, and subjected to flicker value measurement. Thereafter, a wearable optical topography device was attached to the test subject. The test subject was allowed to rest for one minute in the dark room, and after the rest period, the character presentation device including the LED device as the backlight light source was lighted. Then, the Japanese text was presented in the character presentation device, and silently read by the test subject for ten minutes. Thereafter, the test subject was allowed to rest for one minute. Then, the test subject was seated in the chair, and subjected to flicker value measurement, and thereafter was made to answer questionnaires on visibility, subjective symptoms of eye strain, and a subjective symptom survey. Note that for the test, a measurement with a character presentation device using reference white as the backlight light source, and a measurement with a character presentation device using an LED device to be evaluated as the backlight light source were carried out, and these measurements were defined as one trial of the test. To relieve the fatigue, an interval of 15 minutes was provided before starting the test using the subsequent character presentation device. The above-described test was repeatedly performed, and the following items were evaluated. The details of the test are described below.

Under general lighting in the laboratory, the following questionnaires concerning subjective symptoms of eye strain, and subjective symptoms of blurriness were administered to the test subject.

(Subjective Symptoms of Eye Strain)

Before and after the test, subjective symptoms of eye strain were subjectively evaluated by each test subject based on the description in "Shinso Sangyo Hiro Handbook (Handbook of Occupational Fatigue, a newly bound edition)" pp. 362-363 (1995), issued by Working Group for Occupational Fatigue of Japan Society for Occupational Health, according to the criteria shown in Table 2 in FIG. 7. Subjective fatigue was evaluated by each test subject, and the difference was evaluated by subtracting the total score after the test from the total score before the test for the 15 evaluation items in Table 2 shown in FIG. 7.

(Subjective Symptoms of Blurriness)

Before and after the test, subjective fatigue was evaluated by each test subject, using "Subjective Symptom Survey" issued by Working Group for Occupational Fatigue of Japan Society for Occupational Health (2002), shown in Table 3 in FIG. 8, and the difference was evaluated by subtracting the total score after the test from the total score before the test for the five evaluation items of "Blurriness" marked with a circle in Table 3 shown in FIG. 8.

While each test subject was kept seated in the chair in the dark room, the critical fusion frequency was measured by flicker value measurement. Note that the measurement of the critical fusion frequency by flicker value measurement was performed in the following manner.

(Measurement of Critical Fusion Frequency by Flicker Value Measurement)

Using a Roken-type digital flicker value tester, RDF-1 (manufactured by SIBATA SCIENTIFIC TECHNOLOGY LTD.), the critical fusion frequency [Hz] was measured three times in forward and backward directions before and after one minute of rest, the average value was determined, and evaluated from the difference between the values before and after the test. The critical fusion frequency shows a reduction due to fatigue.

According to the International 10-20 system, electrodes of a wearable optical topography device (WOT-220, manufactured by Hitachi High-Technologies Corporation) using near-infrared spectroscopy (NIRS) were attached to the head of each test subject over the medial prefrontal cortex located midway between Fp1 and Fp2, and measurement of signals indicating a change in concentration of oxygenated hemoglobin (hereinafter referred to as oxyHb) in the medial prefrontal cortex using NIRS was started. Note that the measurement of signals indicating a change in oxyHb concentration in the medial prefrontal cortex, using NIRS was performed in the following manner.

(Measurement of Signals Indicating Change in OxyHb Concentration in Medial Prefrontal Cortex, Using NIRS)

The varying concentration of oxyHb was measured with a wearable optical topography device using near-infrared spectroscopy (NIRS). Specifically, using the wearable optical topography device, near-infrared light (about 700 to about 1500 nm) was applied to the brain of the test subject from above the scalp, signals indicating a change in the oxyHb concentration were measured, and the average value was calculated, to observe a change in brain activation. A reduction in the oxyHb concentration in the medial prefrontal cortex indicates a reduction in the brain activation due to fatigue.

(Test Using Character Presentation Device)

After performing the flicker value measurement before the character presentation, each test subject was allowed to rest for one minute in the dark room, and thereafter the backlight light source of the character presentation device was lighted. Then, the Japanese text placed on the emission surface of the character presentation device was silently read by the test subject for ten minutes. Thereafter, the subject was allowed to rest for one minute.

(Visibility Evaluation)

After performing the flicker value measurement after the test, the lighting in the room was lighted, and the viewability of the characters was subjectively evaluated by the test subject according to the criteria shown in Table 4 in FIG. 9.

Furthermore, questionnaires on subjective symptoms of eye strain and subjective symptoms of blurriness were also administered. Then, to relieve the fatigue of the test subject, a rest period of 15 minutes was provided in a bright room.

The evaluation was made according to the following criteria.

A: Superior to reference white
B: Comparable to reference white
C: Inferior to reference white The results of the above-described evaluations are shown in Table 1, with respect to reference white.

Of the emission colors of the LED devices shown in FIG. 4, the emission colors of the cap-equipped LED devices of Examples 1 to 9 have a color purity included in a region of 2 to 50 in a region surrounded by a line segment WB and a line segment WG that connect coordinates W (0.33, 0.33) indicating an achromatic color with coordinates B (0.091, 0.133) of 480 nm and coordinates G (0.373, 0.624) of 560 nm on a spectral locus, and the spectral locus. The emissions of the cap-equipped LED devices of Examples 1 and 5 have a color purity included in a region of 20 or less in the region surrounded by the line segments WB and WG, and the spectral locus, and had favorable visibility. The emission of the cap-equipped LED device of Example 1 was excellent also in resistance to eye strain. The emission of the cap-equipped LED device of Example 5 has a color purity of 17.7, which is larger than the color purity (7.4) of the cap-equipped LED device of Example 1, and therefore had visibility slightly inferior to that of the emission of the cap-equipped LED device of Example 1. The emission of the reference white cap-equipped LED device of Comparative Example 2 had an improved visibility, and the eye strain was kept comparable to that of reference white, but was inferior in the other evaluations (blurriness, reduction in critical fusion frequency, brain activation) due to the use of a red fluorescent substance. The emission of the cap-equipped LED device of Example 2 has a color purity of 47.3, which is close to 50, and therefore also exhibits visibility and eye strain comparable to those of reference white. However, the proportion of the wavelength distribution of 380 to 480 nm was large, and therefore the emission was excellent in terms of the reduction in the critical fusion frequency. The emission of the cap-equipped LED device of Example 3 exhibited visibility and eye strain both comparable to those of reference white. However, the wavelength distribution of 481 to 560 nm was large, and therefore the emission was excellent in brain activation. The emission of the cap-equipped LED device of Example 4 exhibited visibility and eye strain both comparable to those of reference white. However, the proportion of the wavelength distribution of 380 to 480 nm was large, and therefore the emission was excellent in terms of the reduction in critical fusion frequency.

The emissions of the cap-equipped LED devices of Comparative Examples 3 and 4 had a color purity exceeding 50, and had a reduced visibility as compared with the emission of the reference white cap-equipped LED device of Comparative Example 1. The emission of the cap-equipped LED device of Comparative Example 5 had a dominant wavelength of less than 480 nm, caused significant eye strain, and the content ratio of the area at 480 to 540 nm, in which the luminous efficiency is high, was also low in the scotopic standard spectral luminous efficiency. The emission of the cap-equipped LED device of Comparative Example 6 had a dominant wavelength exceeding 560 nm, and caused significant eye strain. The emission of the combined-wavelength LED device of Comparative Example 7 had a wavelength that was not continuous, and the content ratio of the area at 480 to 540 nm, in which the luminous efficiency is high, was also less than 15% in the scotopic standard spectral luminous efficiency, and thus had a reduced visibility and a reduced brain activity.

The emissions of the cap-equipped LED devices of Examples 1, 5, 6, and 8, in which a spectral distribution in a continuous spectrum of the light has an area at 380 to 480 nm of 15 to 30%, an area at 481 to 560 nm of 25 to 62%, an area at 561 to 640 nm of 9 to 35%, and an area at 641 to 780 nm of 1 to 10%, relative to the area at 380 nm to 780 nm, were evaluated as "A" for two or more of the evaluation items, and exhibited a better balance between the high visibility and the properties of being less likely to cause fatigue. In particular, the emissions of the cap-equipped LED devices of Examples 1 and 5, which had a color purity of 5 to 20, were evaluated as "A" for three or more of the evaluation items, and exhibited a better balance between the high visibility and the properties of being less likely to cause fatigue.

REFERENCE SIGNS LIST

1. . . . LED element
2. . . . Package member
2a. . . . Accommodating recess
2b, 2c. . . . Lead
3. . . . fluorescent substance
3Y. . . . YAG fluorescent substance
3G. . . . Green fluorescent substance
3X. . . . Light color adjuster
4. . . . Transparent resin encapsulant
5. . . . LED device body
6. . . . Gold wire
7. . . . Reflection film
9. . . . fluorescent substance cap
10. . . . LED device

The invention claimed is:

1. An LED device comprising an LED element having an emission peak wavelength in a range of 420 to 480 nm, a transparent resin encapsulant that encapsulates the LED element, and a fluorescent substance layer that comprises fluorescent substances and that covers an upper surface of the transparent resin encapsulant or an upper surface of the LED element, wherein the LED device emits light and, in coordinates in a CIE 1931 chromaticity diagram, the light has a color purity included in a region of 2 to 17.7 in a region surrounded by a line segment WB and a line segment WG that connect coordinates W (0.33, 0.33) indicating an achromatic color with coordinates B (0.091, 0.133) of 480 nm and coordinates G (0.373, 0.624) of 560 nm on a spectral locus, and the spectral locus, and has an area occupied by a continuous spectral wavelength in a wavelength region of 480 to 540 nm, of 15% or more relative to an area of an overall spectral wavelength of the light source at 380 to 780 nm.

2. A light emitting display structure comprising:
a display portion; and a background portion around the display portion,
wherein the display portion performs display by emission of the LED device according to claim 1.

3. The light emitting display structure according to claim 2,
wherein the light emitting display structure is an instrument panel of a controlling portion of a mobile object.

4. A light emitting display structure comprising:
a display panel including a display portion including a light-transmitting portion for light for being displayed, and a background portion that blocks light; and a backlight light source disposed on a side opposite to a display surface of the display panel,
wherein the backlight light source comprises the LED device according to claim 1.

5. The LED device according to claim 1,
wherein the LED device emits light that has an area occupied by a continuous spectral wavelength in a wavelength region of 480 to 540 nm, of 15 to 68% relative to an area of an overall spectral wavelength of the light source at 380 to 780 nm.

6. The LED device according to claim 1,
wherein the LED device emits light having the color purity included in a region of 5 to 17.7.

7. The LED device according to claim 1,
wherein a spectral distribution of a continuous spectrum of the light has an area of 15 to 30% at 380 to 480 nm, an area of 25 to 62% at 481 to 560 nm, an area of 9 to 35% at 561 to 640 nm, and an area of 1 to 10% at 641 to 780 nm, relative to an area of an overall spectral wavelength of the light source at 380 nm to 780 nm.

8. The LED device according to claim 7,
wherein, in a spectral distribution of the light, the light has a first peak indicating a maximum emission intensity in a range of 420 to 480 nm, and further has a second peak indicating an emission intensity of 40 to 65% in a range of 481 to 680 nm relative to the maximum emission intensity.

9. The LED device according to claim 8,
wherein, in a spectral distribution of the light, the light has a ratio of an area at 481 to 560 nm to an area at 641 to 780 nm, of 2 to 4.

10. The LED device according to claim 8,
wherein, in a spectral distribution of the light, the light has, between the first peak and the second peak, a valley indicating an emission intensity of 18 to 40% relative to the emission intensity of the first peak.

11. The LED device according to claim 1,
wherein the fluorescent substances comprise at least one fluorescent substance selected from a YAG fluorescent substance having a fluorescence peak wavelength in a range of 520 to 590 nm and a green fluorescent substance having a fluorescence peak wavelength in a range of 470 to 560 nm.

12. The LED device according to claim 11,
wherein the fluorescent substances do not comprise a red fluorescent substance having a fluorescence peak wavelength in a range of 600 to 780 nm.

* * * * *